United States Patent [19]

Cerofolini

[11] Patent Number: 4,965,219
[45] Date of Patent: Oct. 23, 1990

[54] METHOD FOR THE MANUFACTURING OF INSULATED GATE FIELD EFFECT TRANSISTORS (IGFETS) HAVING A HIGH RESPONSE SPEED IN HIGH DENSITY INTEGRATED CIRCUITS

[75] Inventor: Gianfranco Cerofolini, Milan, Italy

[73] Assignee: SGS Microelettronica SpA

[21] Appl. No.: 470,445

[22] Filed: Jan. 19, 1990

Related U.S. Application Data

[63] Continuation of Ser. No. 136,452, Dec. 21, 1987, abandoned, which is a continuation of Ser. No. 757,070, Jul. 19, 1985, abandoned.

[30] Foreign Application Priority Data

Jul. 19, 1984 [IT] Italy .................................. 21968 A/84

[51] Int. Cl.$^5$ .......................................... H01L 21/335
[52] U.S. Cl. .......................................... 437/40; 437/41; 437/89; 437/241; 437/44; 357/23.3
[58] Field of Search ........................ 437/41, 42, 43, 44, 437/233, 228, 238, 241, 89, 90, 91, 968, 40; 156/643, 653, 657; 148/DIG. 51, DIG. 117; 357/59 G, 59 K

[56] References Cited

U.S. PATENT DOCUMENTS

| | | | |
|---|---|---|---|
| 4,072,545 | 2/1978 | De La Moneda | 357/59 K |
| 4,075,045 | 2/1978 | Rideout | 196/653 |
| 4,252,581 | 2/1981 | Anantha et al. | 29/576 E |
| 4,287,661 | 9/1981 | Stoffel | 156/653 |
| 4,354,309 | 10/1982 | Gardiner et al. | 357/59 G |
| 4,381,956 | 5/1983 | Lane | 29/576 E |
| 4,417,385 | 11/1983 | Temple | 29/571 |
| 4,488,162 | 12/1984 | Jambotkar | 437/41 |
| 4,488,931 | 12/1984 | Pasana | 156/653 |
| 4,494,304 | 1/1985 | Yoshioka | 437/162 |
| 4,565,584 | 1/1986 | Tamura et al. | 29/576 E |
| 4,566,914 | 1/1986 | Hall | 29/576 E |
| 4,577,392 | 3/1986 | Peterson | 437/41 |
| 4,651,408 | 3/1987 | MacElwee | . |
| 4,677,736 | 7/1987 | Brown | 437/41 |
| 4,701,423 | 10/1987 | Szluk | 437/44 |
| 4,707,456 | 11/1987 | Thomas | 437/41 |
| 4,713,356 | 12/1987 | Hiruta | 437/41 |

FOREIGN PATENT DOCUMENTS

| | | | |
|---|---|---|---|
| 0093223 | 6/1983 | Japan | 29/576 E |
| 0158970 | 9/1983 | Japan | 437/44 |
| 0152018 | 8/1985 | Japan | 29/576 E |

OTHER PUBLICATIONS

Wong et al "Elevated Source/Drain MOSFET" IEDM Technical Digest pp. 634-637. 12/84.
Ghandhi, S. K. "VLSI Fabrication Principles" 1983 pp. 214-215, 242-245.

Primary Examiner—Brian E. Hearn
Assistant Examiner—Kevin McAndrews
Attorney, Agent, or Firm—Harry M. Weiss

[57] ABSTRACT

The method involves the formation above the substrate of regions of epitaxial type automatically aligned with the gate electrode and designed to form the source and drain regions of the transistor. These regions are doped by ion implantation using a comparatively low implantation energy such that the doping agent does not penetrate into the substrate. By providing the source and drain junctions on the surface of the substrate, rather than in the substrate, there are no lateral junction capacitances and the horizontal dimensions of the IGFET may be reduced, with the result that high response speeds and high integration densities are obtained.

5 Claims, 2 Drawing Sheets

METHOD FOR THE MANUFACTURING OF INSULATED GATE FIELD EFFECT TRANSISTORS (IGFETS) HAVING A HIGH RESPONSE SPEED IN HIGH DENSITY INTEGRATED CIRCUITS

This is a continuation of co-pending application Ser. No. 136,452 filed on Dec. 27, 1987 now abandoned which is a continuation of Ser. No. 06/757,070 filed on Jul. 19, 1985, now abandoned.

BACKGROUND OF THE INVENTION

The present invention relates to insulated gate field effect transistors (IGFETs) and, more particularly, to a method for the manufacture of IGFETs having a high speed of response in high density integrated circuits.

In order to obtain high response speeds and high integration densities, either the horizontal dimensions or the vertical dimensions of the IGFETs have to be reduced ("scaling principle"), It is, in particular, necessary to reduce the depth of the source and drain junctions in the substrate. In conventional, commercially available, IGFETs, the use of very thin junctions has, however, produced detrimental results. This, in effect, increases the layer resistance of the active source and drain regions and decreases the reliability of the contact between these regions and their associated electrodes.

In order to counter the above drawbacks, it has been proposed to construct IGFETs having their active source and drain regions formed on the surface of the substrate, rather than inside the substrate. A structure of this type is disclosed, for example, in the U.K. Patent Specification 1,477,083. However, the method used to obtain this structure, as described in this Patent, are very complex and are not compatible with industrial production requirements.

The object of the present invention is to provide an IGFET having ultra-thin junctions, low layer resistances and extremely reliable contacts, by means of a method which is both simple to carry out and involves a sequence of operations compatible with conventional industrial production processes.

This object is achieved by the method described and set out in the attached claims, and illustrated by way of non-limiting example with reference to the attached drawings.

DETAILED DESCRIPTION OF THE INVENTION

Figure 1:
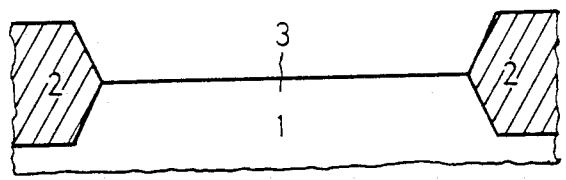
FIGS. 1 to 7 show cross-sections through part of a silicon chip during certain stages to depict the method of the invention.

The starting structure, shown in FIG. 1 is obtained by known operations and comprises a substrate 1 preferably of p-type monocrystalline silicon having a low concentration of doping impurities (approximately $10^{15}$ atoms/cm$^3$) and a resistivity of approximately $20\Omega \times$ cm, in which there is provided a semiconductor region or zone 3 that is used to receive the IGFET. Externally to the zone 3, the substrate contains a layer 2 of silicon dioxide (SiO$_2$) which forms the field dielectric. The formation of the starting structure shown in FIG. 1 can be achieved, for example, by photolithographic oxide-nitride masking, thermal oxidation and etching techniques.

Figure 2:
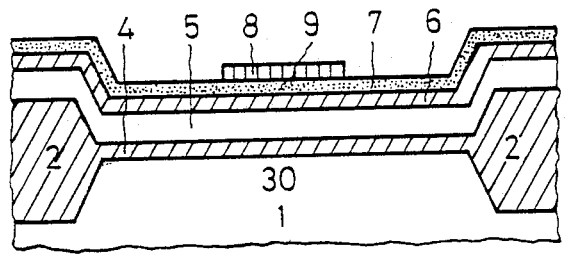
Figure 3:
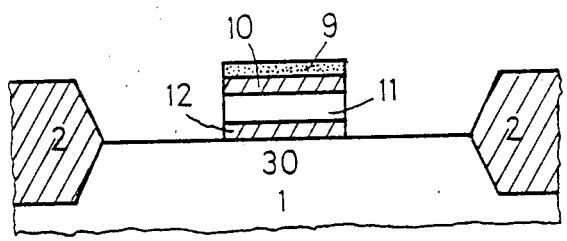
Figure 4:
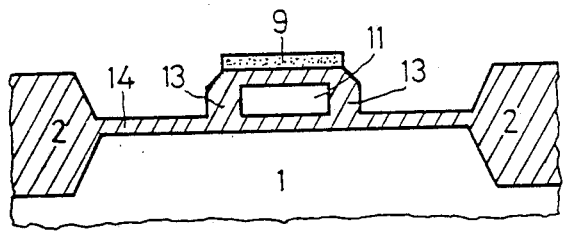
Figure 5:
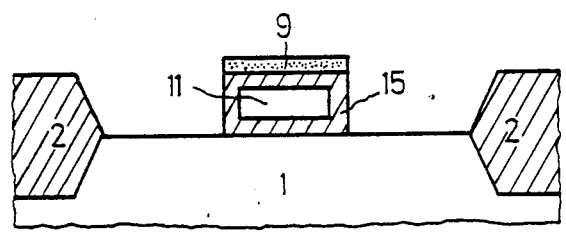
Figure 6:
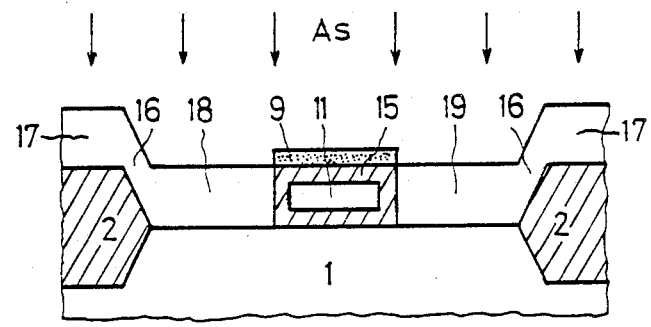
Figure 7:
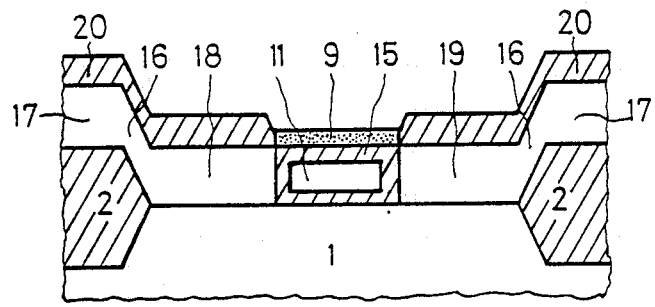

The following operations are carried out in sequence on this starting structure of FIG. 1:

thermal oxidation, preferably at a temperature of approximately 1000° C., of the exposed semiconductor surface of the substrate 1, with the formation of a layer 4 of silicon dioxide (FIG. 2) preferably having a thickness of approximately 350Å which forms the gate dielectric;

silane (SiH$_4$) deposition of a layer 5 of polycrystalline silicon (FIG. 2) having a thickness of approximately 5000Å. The deposition is carried out preferably using the CVD (Chemical Vapor Deposition) technique at a temperature of approximately 500° C.;

doping of the layer 5 of polycrystalline silicon by the preliminary deposition of phosphorus oxychloride (POCl$_3$) at preferably a temperature of approximately 920° C. The concentration of doping impurities (phosphorus atoms) is approximately $10^{20}$ atoms/cm$^3$;

diffusion of the doping impurities within the layer 5 of polycrystalline silicon and growth of a layer 6 of silicon dioxide (FIG. 2) preferably having a thickness of approximately 1500Å, by exposure to a temperature of approximately 1000° C. in an oxidizing atmosphere;

deposition of a layer 7 of silicon nitride (Si$_3$N$_4$) (FIG. 2) having a thickness of approximately 1500Å using the CVD technique at a temperature of approximately 500° C.;

formation of a mask 8 of photoresist (FIG. 2) which protects a portion 9 of the layer 7 of silicon nitride. This mask defines the gate area of the IGFET disposed above a zone 30 of the substrate designed to act as the transistor channel;

removal of the non-protected portions of the layer 7 (FIG. 3) by selective etching (preferably wet etching with phosphoric acid or plasma etching) so as to define the portion 9 of silicon nitride acting as a mask or screen for the portions of the underlying layers included in the gate area;

removal of the photoresist mask 8;

formation of the portion 10 of silicon dioxide, the portion 11 of doped polycrystalline silicon and the portion 12 of gate oxide (FIG. 3) by three successive selective etching operations (preferably wet etching or plasma etching), in which the portions of the layers 6, 5 and 4 not masked or screened by the silicon nitride portion 9 are removed;

thermal oxidation of the silicon surfaces exposed in this way after the above process steps or operations. This oxidation is carried out at a comparatively low temperature of approximately 800° C. in order to cause the growth of the oxide to depend on the concentration of doping impurities in the silicon. Walls 13 of silicon dioxide having a thickness of approximately 1500Å (FIG. 4) grow on the edges of the portion 11 of polycrystalline silicon in which the concentration of doping agent is approximately $10^{20}$ atoms/cm$^3$ and a layer 14 of silicon dioxide having a thickness of approximately 350Å (FIG. 4) grows on the exposed areas of the substrate 1 in which the doping agent concentration is approximately $10^{15}$ atoms/cm$^3$;

reactive ion etching (RIE) of the silicon dioxide formed during the previous operation. This etching takes place in a vertical direction and eliminates the oxide portions which are not masked or screened by the silicon nitride portion 9 (FIG. 5) as a result of which the layer 14 (FIGS. 4 and 5) is removed so as to expose the underlying surface of the substrate 1 while the side walls of the oxide 15 (FIG. 5) are aligned with the lateral surfaces of the portion 9. The thickness of the field oxide 2 is not, however, significantly reduced. The portion 11 of doped polycrystalline silicon forms the gate electrode of the IGFET and is completely surrounded by the silicon dioxide 15 (FIG. 5);

deposition by silicon tetrachloride (SiCl₄) of a layer 16 of silicon (FIG. 6) having a thickness of approximately 7000Å. The deposition is carried out using the CVD technique at a temperature of approximately 1150° C. The silicon strips 17 on the field dielectric 2 are of the polycrystalline silicon type while the silicon regions 18 and 19 located above the base silicon surface portions of the substrate 1 are of the epitaxial silicon type with the same crystal orientation as the substrate, and form the source and drain regions, respectively, of the IGFET. These regions grow vertically on the substrate 1 and do not grow on the nitride 9 as a result of which an automatically aligned structure is obtained. The strips 17 of polycrystalline silicon are used as elements for connection with other components (not shown) of the integrated circuit;

ion implantation of an n-type doping agent, for example, arsenic (As) in the deposited silicon layer 16 (FIG. 6). This implantation is carried out at a low energy level of approximately 80 KeV, so as to provide a weak penetration by the doping agent which decreases to a depth of approximately 1000Å. The dose or impurity amount of the N type doping agent implanted is very high, preferably approximately $5 \times 10^{15}$ atoms/cm², so as to obtain a high conductivity;

exposure in an oxidizing atmosphere to a temperature of preferably approximately 1000° C. for a period sufficient to enable the diffusion of the implanted doping agent to preferably a depth of approximately 5000Å and the growth of a layer 20 of silicon dioxide (FIG. 7) having a thickness of preferably approximately 4000Å above the silicon layer 16.

All the operations described above are followed, if desired, by the normal operations for the opening of the apertures for the gate, source and drain contacts, the formation of the associated electrodes and finally the passivation of the device.

In the method of the invention, the N-type doping agent is implanted to a shallow level in the epitaxial (source and drain) regions 18 and 19 such that the subsequent high temperature heat treatments do not cause the diffusion of this doping agent within the substrate 1, and the drain and source regions do not therefore drop below the gate-substrate-oxide interface. In this situation, there are no lateral junction capacitances. The absence of these capacitances makes it possible to obtain high transistor response speeds. In addition, the empty zones, rather than extending laterally, as in conventional IGFETs, extend vertically below the active regions, as a result of which the working length of the transistor increases and decreases the risk of punch-through.

In order to meet the requirements of planarity, the source and drain thicknesses are greater than those which may be obtained using conventional methods, with a consequent improvement of the relative layer resistances whose values are reduced to approximately one-third of the conventional values.

In order to open the apertures for the source and drain contacts, selective etching is carried out so as to remove portions of the oxide covering the source and drain regions themselves. In the case of conventional methods, it is known that there is a risk, as a result of the masking tolerances, that a portion of the oxide covering the gate electrode may be removed, which may lead to short-circuits between the source and drain regions and the gate electrode. Using the method of this invention, the oxide 15 which surrounds the gate electrode is masked or screened by the silicon nitride 9 which counters the risk mentioned above.

The N doped conductive silicon strips 17 of polycrystalline silicon may be used to provide the contacts to the source and drain regions 18 and 19 as a result of which the horizontal dimensions of the epitaxial regions may be reduced without causing a decrease in the area of the contacts and therefore in their reliability. The high dosage of doping agent implanted in the silicon layer 16 also causes an increase in the conductivity of these contacts.

The strips 17 of polycrystalline silicon, as well as being used as interconnections, may be used, for example, to form resistors (which can have lower doping levels for increased resistance) or even capacitor electrodes or plates. In the case in which it is desired to prevent the formation of the polycrystalline silicon strips 17 above the field oxide layer 2, this field oxide layer has to be protected by a silicon nitride mask.

In a variant of the method of the invention, the active source and drain regions may be obtained by recrystallization of the polycrystalline silicon rather than by epitaxial growth. In this case, a layer of polycrystalline silicon having a thickness of approximately 7,000Å is deposited over the entire surface of the structure shown in FIG. 5. This deposition is carried out using the CVD technique at a temperature of preferably approximately 500° C. The epitaxial source and drain regions are obtained by recrystallizing, using the technique known as "laser annealing", the zones of the polycrystalline silicon layer in contact with the monocrystalline silicon of the substrate. Selective etching is then carried out in order to eliminate the polycrystalline silicon deposited on the silicon nitride portion 9 and the structure shown in FIG. 6 is obtained and is subjected to the same steps of the method described above.

Obviously, in addition to the variant described above, many other modifications may be made to the method of the invention, without departing from its scope. The invention may also be applied to any type of MOS or CMOS process.

The above description is included to illustrate the operation of the preferred embodiment and is not intended to limit the scope of the invention. The scope of the invention is to be limited only by the following claims. From the above description, many variations will be apparent to one skilled in the art that would yet be encompassed by the spirit and scope of the present invention.

What is claimed is:

1. A method for the formation of an insulated gate field effect transistor on a substrate of monocrystalline silicon comprising the steps of:
    forming a gate insulation on said substrate;
    forming a conductive silicon gate layer on said gate insulation;
    forming a screening layer over said conductive silicon gate layer;
    selectively etching said screening layer, said conductive silicon gate layer and said gate insulator to form exposed edges on said conductive silicon gate layer and to expose said substrate;

oxidizing said exposed edges of said conductive silicon gate layer; and following said oxidizing step, depositing epitaxial silicon source-drain regions in contact with said substrate using said screening layer to avoid deposition of silicon over said conductive silicon gate layer.

2. The method according to any one of claim 1 further including the step of doping said epitaxial source-drain regions without substantially doping said substrate.

3. A method for the formation of an insulated gate field effect transistor on a substrate of monocrystalline silicon comprising the steps of, in the order recited:

forming a gate insulation on said substrate;

forming a conductive silicon gate layer on said gate insulation;

forming a silicon nitride screening layer over said conductive silicon gate layer;

selectively etching said silicon nitride screening layer, said conductive silicon gate layer and said gate insulator to form exposed edges on said conductive silicon gate layer and to expose said substrate;

oxidizing said exposed edges of said conductive silicon gate layer; and growing epitaxial silicon source-drain regions in contact with said substrate.

4. The method of claim 3, wherein said screening layer comprises silicon nitride.

5. The method according to either one of claim 1, further including the step of forming a thick insulator over said substrate away from said conductive silicon gate layer, and said step of forming epitaxial silicon source-drain region in contact with said substrate includes forming a silicon layer over said thick insulator.

* * * * *